United States Patent
Lauer et al.

(10) Patent No.: US 11,469,485 B2
(45) Date of Patent: Oct. 11, 2022

(54) EMBEDDED MICROSTRIP TRANSMISSION LINE

(71) Applicant: International Business Machines Corporation, Armonk, NY (US)

(72) Inventors: Isaac Lauer, Chappaqua, NY (US); William Francis Landers, Wappingers Falls, NY (US); Srikanth Srinivasan, Mount Kisco, NY (US); Neereja Sundaresan, Mount Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 136 days.

(21) Appl. No.: 17/076,107

(22) Filed: Oct. 21, 2020

(65) Prior Publication Data

US 2022/0123449 A1 Apr. 21, 2022

(51) Int. Cl.
*H01P 3/08* (2006.01)
*G06N 10/00* (2022.01)
*H01B 12/06* (2006.01)
*H01P 11/00* (2006.01)

(52) U.S. Cl.
CPC ............ *H01P 3/081* (2013.01); *G06N 10/00* (2019.01); *H01B 12/06* (2013.01); *H01P 11/003* (2013.01)

(58) Field of Classification Search
CPC ....... H01P 3/081; H01P 11/003; G06N 10/00; H01B 12/06
See application file for complete search history.

(56) References Cited

U.S. PATENT DOCUMENTS

| | | | |
|---|---|---|---|
| 3,725,213 A | * | 4/1973 | Pierce ................ H01L 39/2493 427/63 |
| 8,247,799 B2 | | 8/2012 | Bunyk et al. |
| 9,972,589 B1 | | 5/2018 | Goh et al. |
| 10,235,634 B1 | | 3/2019 | Chen et al. |
| 10,692,795 B2 | | 6/2020 | Nah et al. |

(Continued)

FOREIGN PATENT DOCUMENTS

| | | | |
|---|---|---|---|
| JP | H09246814 A | * | 9/1997 |
| JP | 2001-358505 A | | 12/2001 |
| JP | 2006041723 A | * | 2/2006 |

OTHER PUBLICATIONS

International Search Report and Written Opinion received for PCT Application Serial No. PCT/EP2021/079002 dated Jan. 25, 2022, 15 pages.

(Continued)

*Primary Examiner* — Dinh T Le
(74) *Attorney, Agent, or Firm* — Amin, Turocy & Watson, LLP

(57) ABSTRACT

Techniques regarding an embedded microstrip transmission line implemented in one more superconducting microwave electronic devices are provided. For example, one or more embodiments described herein can comprise an apparatus, which can include a superconducting material layer positioned on a raised portion of a dielectric substrate. The raised portion can extend from a surface of the dielectric substrate. The apparatus can also comprise a dielectric film that covers at least a portion of the superconducting material layer and the raised portion of the dielectric substrate.

18 Claims, 12 Drawing Sheets

(56) References Cited

U.S. PATENT DOCUMENTS

| | | |
|---|---|---|
| 2003/0107033 A1* | 6/2003 | Tzalenchuk ........... G06N 10/00 257/30 |
| 2019/0267692 A1 | 8/2019 | Roberts et al. |
| 2019/0363238 A1 | 11/2019 | Rosenblatt et al. |
| 2020/0012961 A1 | 1/2020 | Kelly et al. |
| 2020/0083584 A1 | 3/2020 | Olivadese et al. |

OTHER PUBLICATIONS

Weber et al., "Single crystal silicon capacitors with low microwave loss in the single photon regime" arXiv:1102.2917v2 [cond-mat.mes-hall], XP080499041, Feb. 14, 2011, 3 pages.

Bruno et al. "Investigation of dielectric losses in hydrogenated amorphous silicon (a-Si:H) thin films using superconducting microwave resonators" Physics Procedia 36 (2012) 245-249 5 pages.

Motta et al. "Determining eigenstates and thermal states on a quantum computer using quantum imaginary time evolution", Nat. Phys. 16, http://arxiv.org/abs/1901.07653v3, Feb. 16, 2020. 18 pages.

Sleijpen et al. "A Jacobi-Davidson Iteration Method for Linear Eigenvalue Problems", SIAM review 42.2 267-293 (2000), 25 pages.

Orus "A Practical Introduction to Tensor Networks: Matrix Product States and Projected Entangled Pair States", Annals of Physics 349 117-158 (2014), arXiv:1306.2164v3 [cond-mat.str-el] Jun. 10, 2014, 51 pages.

\* cited by examiner

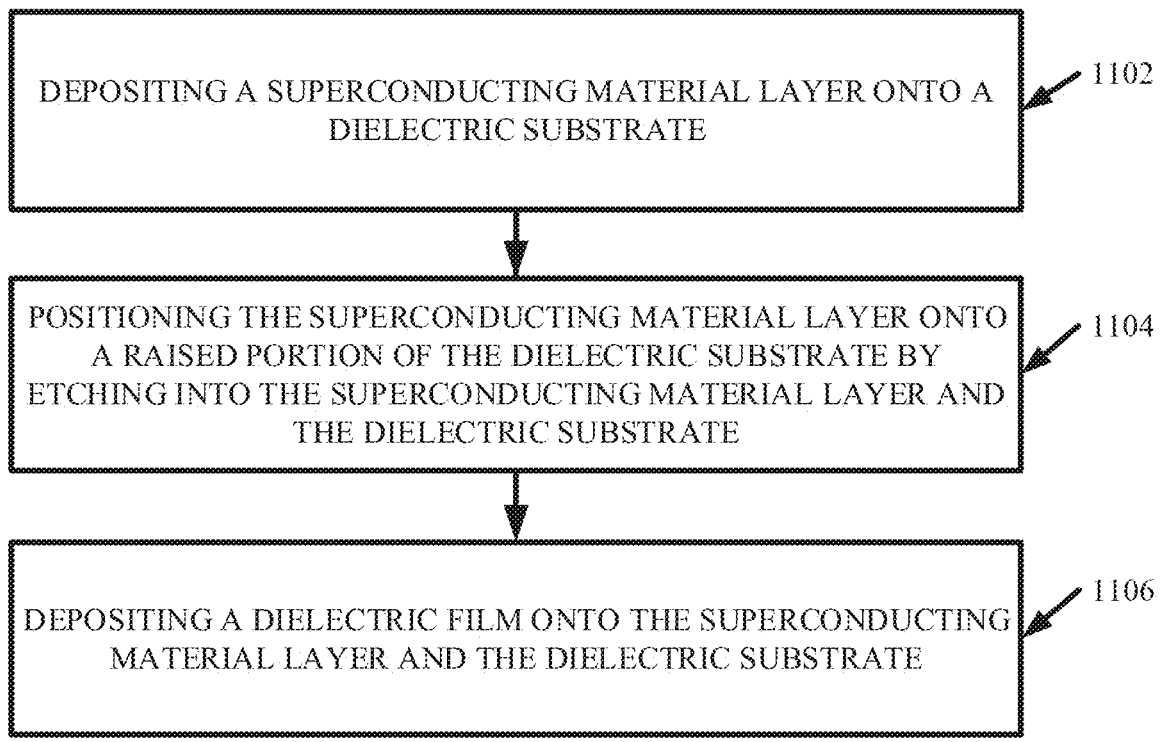

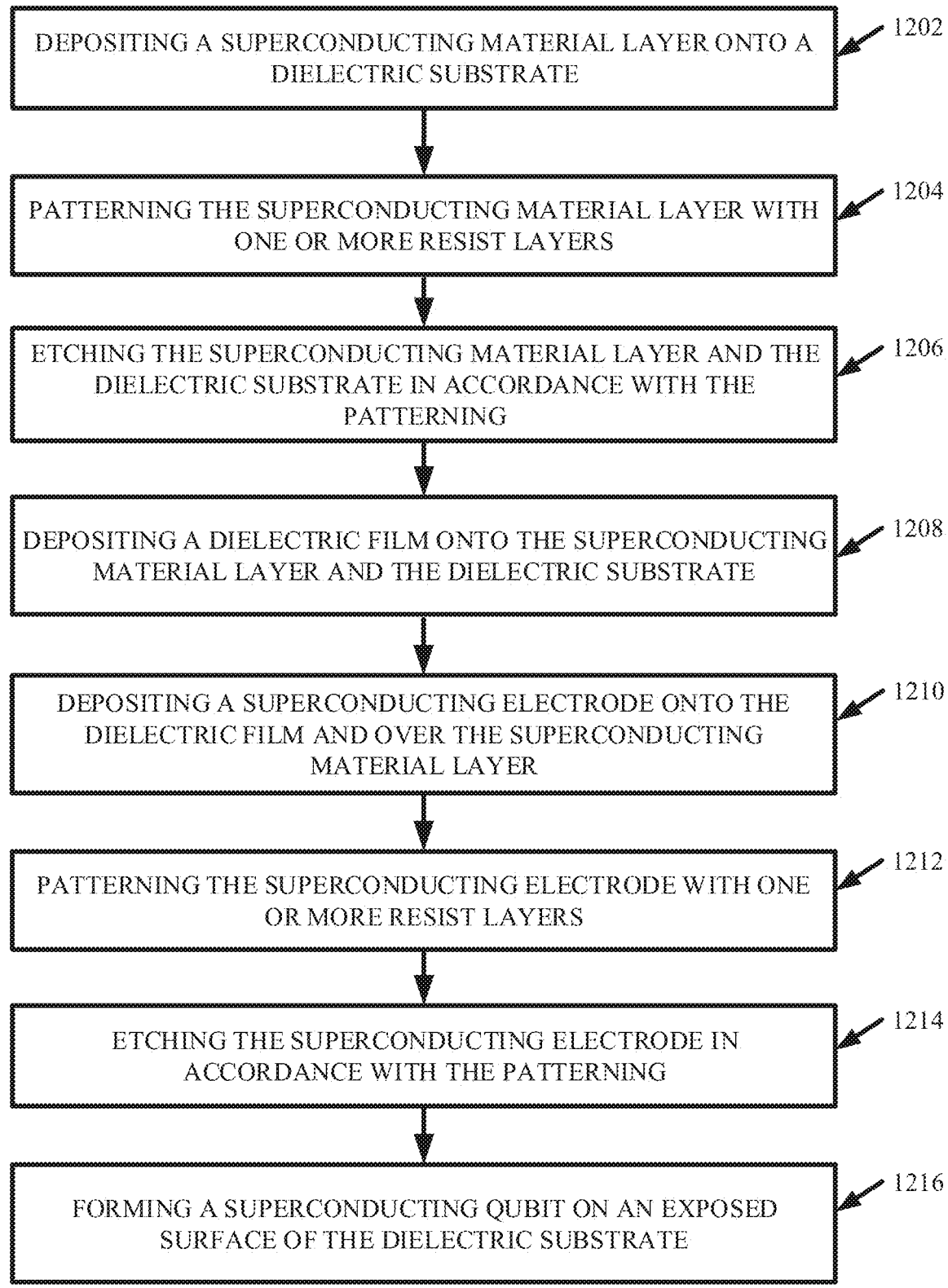

EMBEDDED MICROSTRIP TRANSMISSION LINE

BACKGROUND

The subject disclosure relates to the structure and/or fabrication of embedded microstrip transmission lines, and more specifically, to one or more microstrip transmission lines that can be embedded underneath a superconducting ground plane to reduce crosstalk within a superconducting microwave electronic device.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, apparatuses, and/or methods regarding embedded microstrip transmission lines are described.

According to an embodiment, an apparatus is provided. The apparatus can comprise a superconducting material layer positioned on a raised portion of a dielectric substrate. The raised portion can extend from a surface of the dielectric substrate. The apparatus can also comprise a dielectric film that covers at least a portion of the superconducting material layer and the raised portion of the dielectric substrate.

According to an embodiment, a method is provided. The method can comprise depositing a superconducting material layer onto a dielectric substrate. The method can also comprise positioning the superconducting material layer onto a raised portion of the dielectric substrate by etching into the superconducting material layer and the dielectric substrate; Additionally, the method can comprise depositing a dielectric film onto the superconducting material layer and the dielectric substrate.

According to an embodiment, another apparatus is provided. The apparatus can comprise a first chip that includes a superconducting qubit positioned on a first dielectric substrate. The apparatus can also comprise a second chip bonded to the first chip that can include: a superconducting material layer positioned on a raised portion of a second dielectric substrate, and a dielectric film that covers at least a portion of the superconducting material layer and the raised portion. The raised portion can extend from a surface of the dielectric substrate

BRIEF DESCRIPTION OF THE DRAWINGS

FIG. 11 illustrates a flow diagram of an example, non-limiting method that can facilitate fabricating an embedded microstrip transmission line in accordance with one or more embodiments described herein.

FIG. 12 illustrates a flow diagram of an example, non-limiting method that can facilitate fabricating an embedded microstrip transmission line in accordance with one or more embodiments described herein.

DETAILED DESCRIPTION

Figure 1:
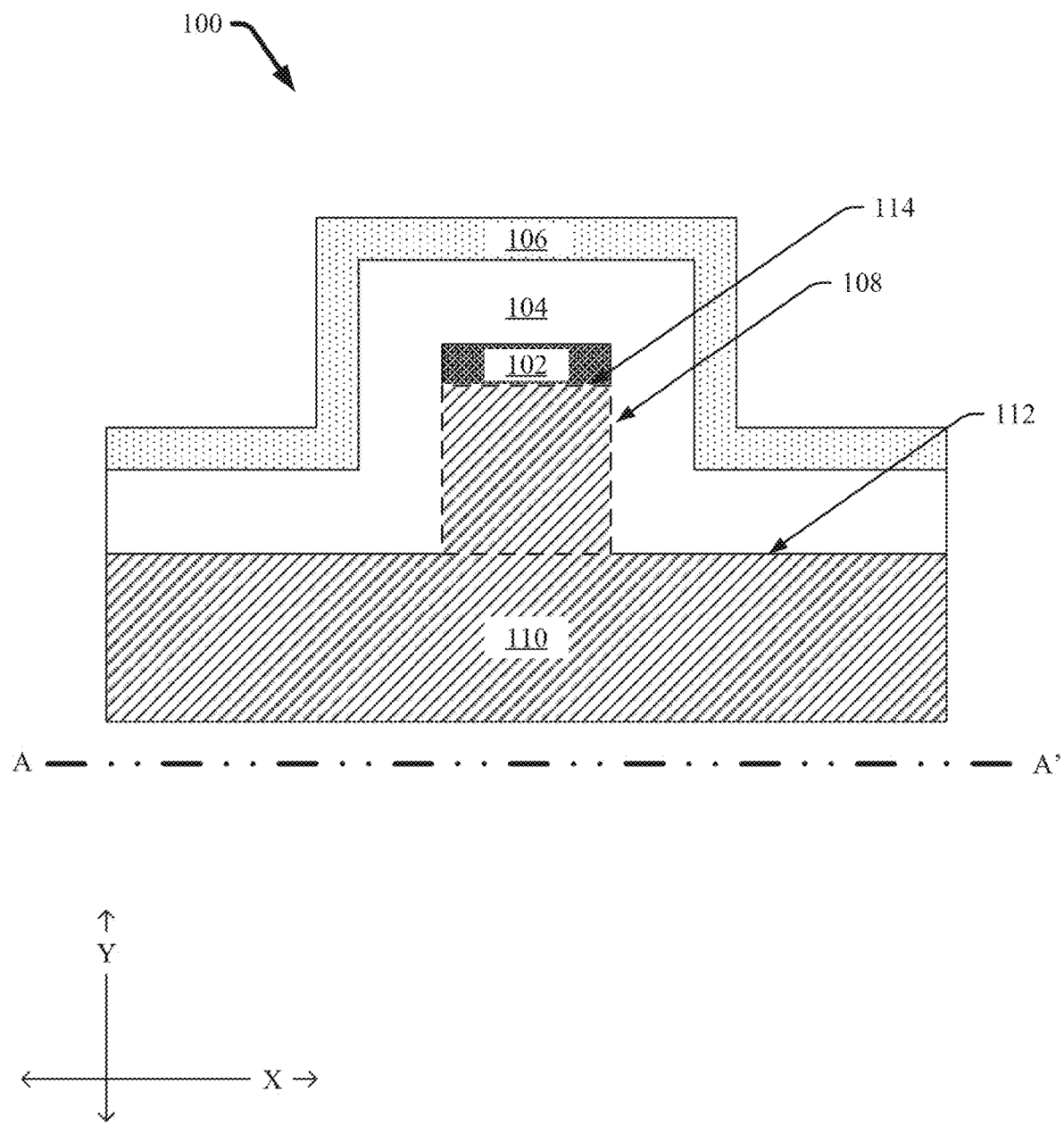
FIG. 1 illustrates a diagram of an example, non-limiting microstrip transmission line structure that can be embedded under the ground plane of one or more superconducting microwave devices in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Additionally, features depicted in the drawings with like shading, cross-hatching, and/or coloring can comprise shared compositions and/or materials.

Superconducting microwave electronics utilize transmission lines for carrying signals and/or as building blocks for circuit elements such as filters and/or resonators. Conventionally, coplanar waveguide ("CPW") transmission lines fabricated from superconducting materials have been employed due to simplicity of fabrication and/or as low-loss tangent elements. However, CPW transmission lines can experience a high amount of crosstalk, which can limit the miniaturization and/or placement of transmission lines on a chip. To prevent unacceptable levels of crosstalk, the CPW transmission lines must be physically spaced relatively far apart. Further, conventional techniques shield CPW transmission lines using, for example, air-bridge ground straps and/or ground bumps. Thus, the surface area of a superconducting microwave electronic device can be substantially covered by transmission lines. For example, a considerable portion of a quantum processor chip can be composed of transmission lines. Thus, circuitry architecture (e.g., such as the number and/or placement of qubits in a quantum processor) can be limited by the size, number, and/or location of the CPW transmission lines and/or shielding elements.

Various embodiments of the present invention can be directed to apparatuses, systems, and/or methods regarding embedded microstrip transmission lines. For example, one or more embodiments described herein can regard a microstrip transmission line positioned underneath a superconducting ground plane. The microstrip transmission line can be located on a raised portion of a recessed substrate and/or can be covered by a low-loss dielectric film. The structure of the microstrip transmission line can achieve a shielding that reduces crosstalk. In various embodiments, the reduction in crosstalk experienced by the embedded microstrip transmission lines can enable a higher density of transmission lines, as compared to conventional techniques. Further, in one or more embodiments the embedded microstrip transmission lines can be employed in one or more quantum computing devices, such as readout resonators.

As described herein, the terms "deposition process" and/or "deposition processes" can refer to any process that grows, coats, deposits, and/or otherwise transfers one or more first materials onto one or more second materials. Example deposition processes can include, but are not limited to: physical vapor deposition ("PVD"), chemical vaper deposition ("CVD"), electrochemical deposition ("ECD"), atomic layer deposition ("ALD"), low-pressure chemical vapor deposition ("LPCVD"), plasma enhanced chemical vapor deposition ("PECVD"), high density plasma chemical vapor deposition ("HDPCVD"), sub-atmospheric chemical vapor deposition ("SACVD"), rapid thermal chemical vapor deposition ("RTCVD"), in-situ radical assisted deposition, high temperature oxide deposition ("HTO"), low temperature oxide deposition ("LTO"), limited reaction processing CVD ("LRPCVD"), ultrahigh vacuum chemical vapor deposition ("UHVCVD"), metalorganic chemical vapor deposition ("MOCVD"), physical vapor deposition ("PVD"), chemical oxidation, sputtering, plating, evaporation, spin-on-coating, ion beam deposition, electron beam deposition, laser assisted deposition, chemical solution deposition, a combination thereof, and/or the like.

As described herein, the terms "etching process", "etching process", "removal process", and/or "removal processes" can refer to any process that removes one or more first materials from one or more second materials. Example etching and/or removal processes can include, but are not limited to: wet etching, dry etching (e.g., reactive ion etching ("RIE"), deep reactive ion etching ("DRIE"), and/or the like), chemical-mechanical planarization ("CMP"), a combination thereof, and/or the like.

As described herein, the terms "lithography process" and/or "lithography processes" can refer to the formation of three-dimensional relief images or patterns on a material for subsequent transfer of the pattern to the material. In lithography, the patterns can be formed by a light sensitive polymer called a photo-resist. To build the complex structures that make up an electronic device and the many wires that connect the various features of a circuit, lithography processes and/or etch pattern transfer steps can be repeated multiple times. Each pattern being printed on the wafer can be aligned to the previously formed patterns and slowly the subject features (e.g., conductors, insulators and/or selectively doped regions) can be built up to form the final device.

As described herein, the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials (e.g., hydride superconductors, such as lithium/magnesium hydride alloys) can be used in the various embodiments described herein.

As described herein, the term "low-loss" can characterize a material that exhibits a loss tangent at a microwave frequency (e.g., between about 1 and about 10 giga hertz (GHz)) that is equal to or less than e-5.

FIG. 1 illustrates a diagram of an example, non-limiting cross-sectional view of a microstrip transmission line structure 100. Repetitive description of like elements employed in other embodiments described herein is omitted for sake of brevity. FIG. 1 shows a cross-sectional view of the microstrip transmission line structure 100 along the exemplary A-A' plane. Further, the microstrip transmission line structure 100 can include a superconducting material layer 102 at least partially covered by a dielectric film 104 and positioned under a superconducting electrode 106. Further, the superconducting material layer 102 can be positioned on a raised portion 108 of a substrate 110.

In various embodiments, the substrate 110 can be a low-loss substrate. For example, the substrate 110 can comprise a low-loss dielectric material suitable for a superconducting microwave electronic device. In one or more embodiments, the substrate 110 can be suitable for use in one or more quantum computing circuit elements. Example materials that can be comprised within the substrate 110 can include, but are not limited to: silicon, sapphire, silicon-on-insulator ("SOI"), a combination thereof, and/or the like. For instance, in one or more embodiments the substrate 110 can be a silicon wafer.

As shown in FIG. 1, a top surface 112 of the substrate 110 (e.g., along the "Y" axis shown in FIG. 1) can be recessed to define the raised portion 108 of the substrate 110. For example, the raised portion 108 can extend from the top surface 112 to a distal end 114. The distal end 114 can extend from the top surface 112 to a height (e.g., along the "Y" axis shown in FIG. 1) ranging from, for example, greater than or equal to 10 nanometers (nm) and less than or equal to 500 nm. Additionally, the raised portion 108 can have a width (e.g., along the "X" axis shown in FIG. 1) based on one or more operating characteristics of the resulting microstrip transmission line (e.g., such as 10 micrometers (μm)). For example, the raised portion 108 can have a width (e.g., along the "X" axis shown in FIG. 1) ranging from greater than or equal to 2 μm and less than or equal to 20 μm.

The location of the raised portion 108 on the substrate 110 can depend on the desired location of the microstrip transmission line structure 100. Further, in various embodiments the raised portion 108 can traverse the top surface 112 in accordance with one or more patterns to facilitate a desired circuitry layout on the substrate 110. While FIG. 1 illustrates a single microstrip transmission line structure 100 on the substrate 110, the architecture is not so limited. For example, a plurality of microstrip transmission line structures 100 can be positioned on the substrate 110. Where a plurality of microstrip transmission line structures 100 are employed, each microstrip transmission line structure 100 can include one or more superconducting material layers 102 positioned on respective raised portions 108. In one or more embodiments, a single microstrip transmission line can be positioned on each raised portion 108 in accordance with the microstrip transmission line structure 100.

The one or more superconducting material layers 102 can form one or more microstrip transmission lines and/or one or more other circuitry elements (e.g., capacitance paddles, bus resonators, direct capacitive couplers (e.g., between qubits), qubit-qubit coupling elements, input/output capacitors, readout resonators, Purcell filters, a combination thereof, and/or the like). Example superconducting materials that can be comprised within the one or more superconducting material layers 102 can include, but are not limited to: niobium, aluminum, titanium, tantalum, rhenium, titanium nitride, a combination thereof, and/or the like. For instance, the one or more superconducting material layers 102 can be one or more layers of niobium. In various embodiments, the one or more superconducting material layers 102 can be located on the surface of the distal end 114 of the raised portion 108. For example, the positioning of the one or more superconducting material layers 102 can be confined to the raised portion 108.

In one or more embodiments, the one or more superconducting material layers 102 can have a thickness (e.g., along the "Y" axis shown in FIG. 1) ranging from, for example, greater than or equal to 10 nm and less than or equal to 500 nm. Also, the one or more superconducting material layers 102 can have a width (e.g., along the "X" axis shown in FIG. 1) ranging from, for example, greater than or equal to 2 μm and less than or equal to 20 μm. Although FIG. 1 depicts the one or more superconducting material layers 102 comprising a single layer, the architecture of the one or more superconducting material layers 102 is not so limited. Embodiments in which the one or more superconducting material layers 102 comprise a plurality of layers are also envisaged. Further, where the one or more superconducting material layers 102 comprise a plurality of layers, the composition of each layer can be the same or different. Additionally, the thickness and/or width of the one or more superconducting material layers 102 can be substantially the same as the one or more superconducting material layers 102 traverse the raised portion 108 or can vary along one or more portions of the raised portion 108.

The one or more superconducting material layers 102 can be substantially covered, or at least partially covered, by one or more dielectric films 104. In various embodiments, the one or more dielectric films 104 can comprise a low-loss dielectric material. Example materials that can be comprised within the one or more dielectric films 104 can include, but are not limited to: hydrogenated amorphous silicon ("α-Si: H"), polysilicon, silicon germanium, a combination thereof, and/or the like. In one or more embodiments, the one or more dielectric films 104 can have a thickness (e.g., along the "Y" axis shown in FIG. 1) over the one or more superconducting material layers 102 ranging, for example, from greater than or equal to 10 nm and less than or equal to 2 μm.

As shown in FIG. 1, the one or more dielectric films 104 can cover the one or more superconducting material layers 102 and/or the raised portion 108 of the substrate 110. For example, the one or more dielectric films 104 can extend (e.g., along the "X" axis shown in FIG. 1) from a position over the one or more superconducting material layers 102 and/or raised portion 108 to a position over the recessed top surface 112 of the substrate 110. In various embodiments, the one or more superconducting material layers 102 can be embedded between the distal end 114 of the raised portion 108 and the one or more dielectric films 104. Further, the one or more dielectric films 104 can be patterned to expose one or more portions of the one or more superconducting material layers 102 in accordance with one or more embodiments described herein.

The superconducting electrode 106 can be further positioned on the one or more dielectric films 104. In various embodiments, the superconducting electrode 106 can be a superconducting ground plane for one or more superconducting microwave devices. Example superconducting materials that can be comprised within the superconducting electrode 106 can include, but are not limited to: aluminum, niobium, titanium, tantalum, rhenium, titanium nitride, a combination thereof, and/or the like. As shown in FIG. 1, the superconducting electrode 106 can extend from a position over the one or more superconducting material layers 102 and/or raised portion 108 to a position over the top surface 112 of the substrate 110. For example, where the superconducting electrode 106 is positioned over the top surface 112, the superconducting electrode 106 can be located at a height from the top surface 112 that is below the distal end 114 of the raised portion 108. Thereby, at least a portion of the superconducting electrode 106 can be positioned at a height (e.g., along the "Y" axis") below the height of the one or more superconducting material layers 102. Thus, the superconducting electrode 106 can at least partially surround the one or more superconducting material layers 102.

In various embodiments, the superconducting electrode 106 can further be patterned to facilitate the creation of one or more circuitry elements on the substrate 110. For example, the superconducting electrode 106 can be patterned to couple one or more signals to the embedded microstrip transmission line formed by the one or more superconducting material layers 102.

Figure 2:
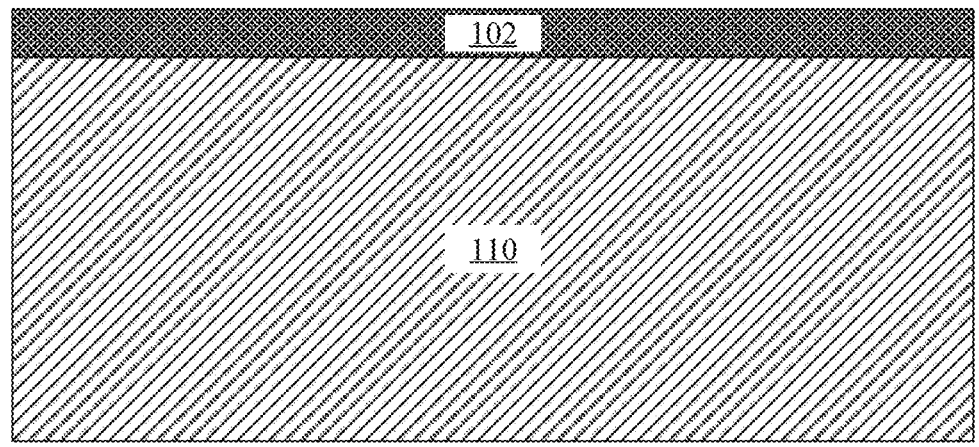
FIG. 2 illustrates a diagram of an example, non-limiting microstrip transmission line during a first stage of manufacturing in accordance with one or more embodiments described herein.

FIG. 2 illustrates a diagram of the example, non-limiting microstrip transmission line structure 100 during a first stage of manufacturing. Repetitive description of like elements employed in other embodiments described herein is omitted for sake of brevity. As shown in FIG. 2, during the first stage of manufacturing the one or more superconducting material layers 102 can be deposited onto the substrate 110. The one or more superconducting material layers 102 can be deposited via one or more deposition processes, such as sputtering. Subsequent to the depositing at the first stage of manufacturing, the one or more superconducting material layers 102 and/or substrate 110 can be patterned to define one or more superconducting circuitry elements, such as an embedded microstrip transmission line (e.g., as shown in FIG. 1).

Figure 3:
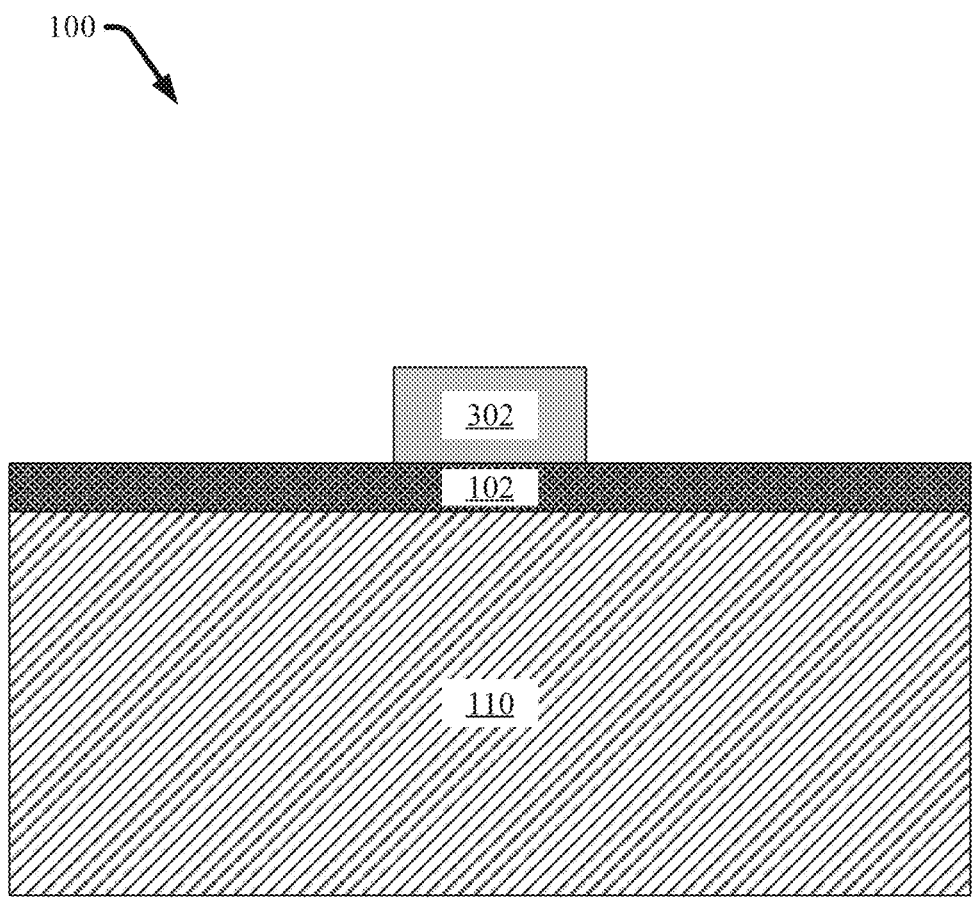
FIG. 3 illustrates a diagram of an example, non-limiting microstrip transmission line during a second stage of manufacturing in accordance with one or more embodiments described herein.

FIG. 3 illustrates a diagram of the example, non-limiting microstrip transmission line structure 100 during a second stage of manufacturing. Repetitive description of like elements employed in other embodiments described herein is omitted for sake of brevity. As shown in FIG. 3, during the second stage of manufacturing one or more resist layers 302 can be deposited onto the one or more dielectric layers 104 via one or more deposition processes. In various embodiments, the one or more resist layers 302 can be patterned onto the one or more superconducting material layers 102 at locations corresponding to the desired location for one or more microstrip transmission lines and/or one or more other circuitry elements formed from the one or more superconducting material layers (e.g., resonators, filters, capacitive pads, bus resonators, direct capacitive filters, a combination thereof, and/or the like).

In various embodiments, the one or more resist layers 302 can protect portions of the one or more superconducting material layers 102 and/or substrate 110 from one or more subsequent etching processes. The thickness of the one or more resist layers 302 (e.g., along the "Y" axis shown in FIG. 3) can depend on the amount of etching performed by the one or more etching processes and/or a composition of the resist layers 302. For example, a thickness of the one or more resist layers 302 can range from greater than or equal to 500 nm and less than or equal to 3 μm. Example materials that can be comprised within the one or more resist layers 302 can include, but are not limited to: polymethyl methacrylate ("PMMA"), AZ5214, SU-8, a combination thereof, and/or the like. For instance, in one or more embodiment the one or more resist layers 302 can be photoresist layers.

Figure 4:
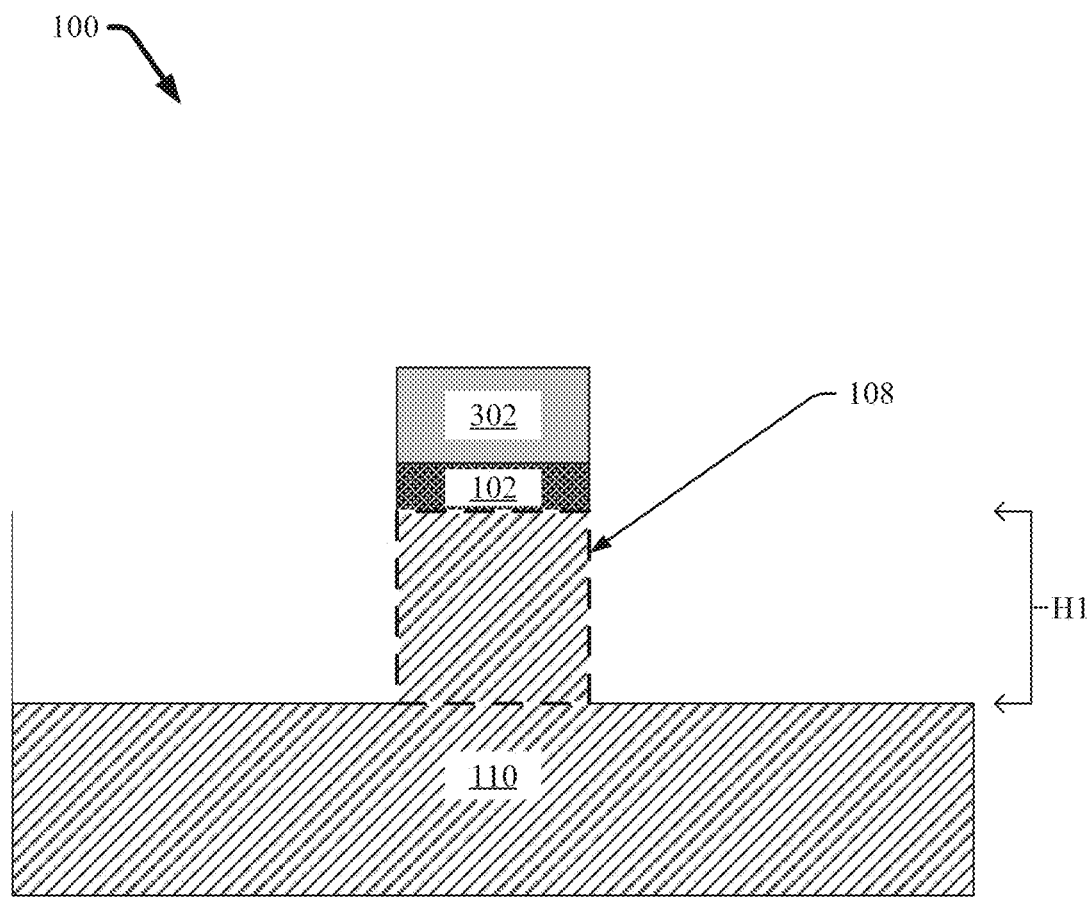
FIG. 4 illustrates a diagram of an example, non-limiting microstrip transmission line during a third stage of manufacturing in accordance with one or more embodiments described herein.

FIG. 4 illustrates a diagram of the example, non-limiting microstrip transmission line structure 100 during a third stage of manufacturing. Repetitive description of like elements employed in other embodiments described herein is omitted for sake of brevity. As shown in FIG. 4, during the third stage of manufacturing one or more portions of the one or more superconducting material layers 102 and/or substrate 110 can be removed via one or more etching processes. For example, RIE can be employed during the third stage of manufacturing to selectively remove portions of the one or more superconducting material layers 102 and/or substrate 110.

As shown in FIG. 4, portions of the one or more superconducting material layers 102 and/or substrate 110 covered by the one or more resist layers 302 can be protected from the one or more etching processes. As a result of the one or more etching processes, the top surface 112 of the substrate can be recessed to define the raised portion 108. For example, the raised portion 108 can be a portion of the substrate 110 covered by the one or more resist layers 302 and thereby protected from the one or more etching processes. In various embodiments, the one or more etching processes can define a height (e.g., represented by "H1" in FIG. 4) of the raised portion 108 from the top surface 112 and thereby a height (e.g., represented by "H1" in FIG. 4) of the one or more superconducting material layers 102 from the top surface 112. Subsequent to the one or more etching processes, the one or more resist layers 302 can be removed.

Figure 5:
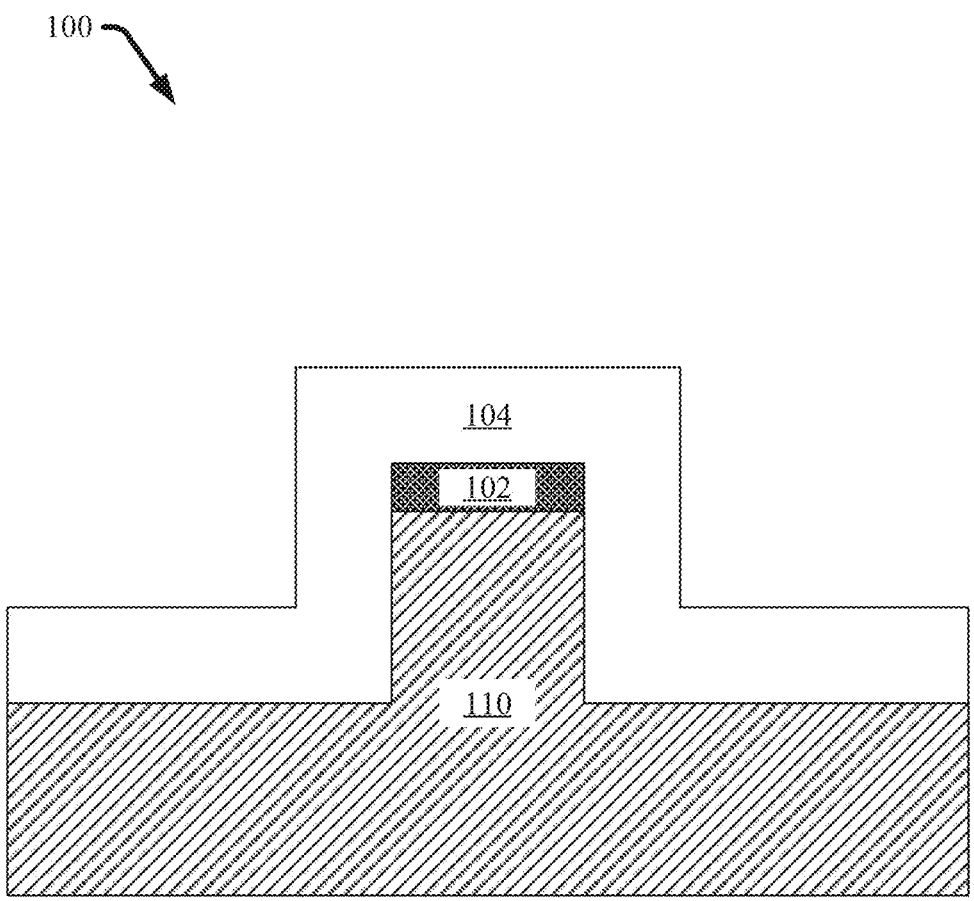
FIG. 5 illustrates a diagram of an example, non-limiting microstrip transmission line during a fourth stage of manufacturing in accordance with one or more embodiments described herein.
Figure 5:
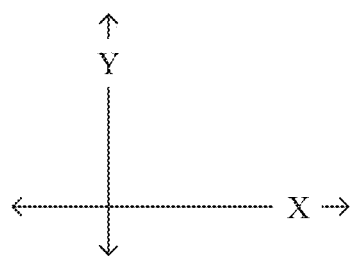

FIG. 5 illustrates a diagram of the example, non-limiting microstrip transmission line structure 100 during a fourth stage of manufacturing. Repetitive description of like elements employed in other embodiments described herein is omitted for sake of brevity. As shown in FIG. 5, during the fourth stage of manufacturing the one or more dielectric films 104 can be deposited onto the one or more superconducting material layers 102 and/or the substrate 110 via one or more deposition processes. For example, the one or more dielectric films 104 can be deposited via CVD, PECVD, sputtering, catalyzed CVD, a combination thereof, and/or the like.

As show in FIG. 5, the one or more dielectric films 104 can cover the one or more superconducting material layers 102, the raised portion 108 of the substrate 110, and/or the top surface of the substrate 110. In various embodiments, the one or more dielectric films 104 can exhibit a constant, or near constant, thickness. In one or more embodiments, portions of the dielectric films 104 can be thinner or thicker with regards to other portions of the dielectric films 104. Further, in various embodiments the one or more dielectric films 104 can be patterned to facilitate the creation of one or more circuitry elements from the one or more superconducting material layers 102. For example, the one or more dielectric films 104 can be patterned to cover one or more portions of the one or more superconducting material layers 102 while leaving one or more other portions of the one or more superconducting material layers 102 exposed.

During a fifth stage of manufacturing, the one or more superconducting electrodes 106 can be further deposited onto the one or more dielectric films 104 to achieve the structure depicted in FIG. 1. The one or more superconducting electrodes 106 can be deposited via one or more deposition processes, such as sputtering, electron-beam evaporation, and/or the like.

In various embodiments, the one or more superconducting electrodes 106 can exhibit a constant, or near constant, thickness. In one or more embodiments, portions of the superconducting electrode 106 can be thinner or thicker with regards to other portions of the superconducting electrode 106. Further, in various embodiments the one or more superconducting electrodes 106 can be patterned to facilitate the creation of one or more circuitry elements coupled to the one or more superconducting material layers 102. For example, the one or more superconducting electrodes 106 can be patterned via one or more lithography processes, etching processes, resist-strips, and/or cleaning processes.

In various embodiments, the microstrip transmission line structure 100 can be employed in one or more microwave electronic devices, such as quantum computers and/or quantum computer devices. For example, the microstrip transmission line structure 100 can be employed in one or more quantum computers comprising quantum hardware devices that can utilize the laws of quantum mechanics (e.g., such as superposition and/or quantum entanglement) to facilitate computational processing (e.g., while satisfying the DiVincenzo criteria). In one or more embodiments, the one or more quantum computers can comprise a quantum data plane, a control processor plane, a control and measurement plane, and/or a qubit technology.

In one or more embodiments, the quantum data plane can include one or more quantum circuits comprising physical qubits, structures to secure the positioning of the qubits, and/or support circuitry. The support circuitry can, for example, facilitate measurement of the qubits' state and/or perform gate operations on the qubits (e.g., for a gate-based system). In some embodiments, the support circuitry can comprise a wiring network that can enable multiple qubits to interact with each other. Further, the wiring network can facilitate the transmission of control signals via a direct electrical connection and/or electromagnetic radiation (e.g., optical, microwave, and/or low-frequency signals). For instance, the support circuitry can comprise one or more superconducting resonators operatively coupled to the one or more qubits.

In one or more embodiments, the control processor plane can identify and/or trigger a Hamiltonian sequence of quantum gate operations and/or measurements, wherein the sequence executes a program (e.g., provided by a host processor) for implementing a quantum algorithm. For example, the control processor plane can convert compiled code to commands for the control and measurement plane. In one or more embodiments, the control processor plane can further execute one or more quantum error correction algorithms.

In one or more embodiments, the control and measurement plane can convert digital signals generated by the control processor plane, which can delineate quantum operations to be performed, into analog control signals to perform the operations on the one or more qubits in the quantum data plane. Also, the control and measurement plane can convert one or more analog measurement outputs of the qubits in the data plane to classical binary data that can be shared with other computer components.

One of ordinary skill in the art will recognize that a variety of qubit technologies can provide the basis for the one or more qubits of the one or more quantum computers. Two exemplary qubit technologies can include trapped ion qubits and/or superconducting qubits. For instance, wherein the quantum computer utilizes trapped ion qubits, the quantum data plane can comprise a plurality of ions serving as qubits and one or more traps that serve to hold the ions in specific locations. Further, the control and measurement plane can include: a laser or microwave source directed at one or more of the ions to affect the ion's quantum state, a laser to cool and/or enable measurement of the ions, and/or one or more photon detectors to measure the state of the ions. In another instance, superconducting qubits (e.g., such as superconducting quantum interference devices "SQUIDs") can be lithographically defined electronic circuits that can be cooled to milli-Kelvin temperatures to exhibit quantized energy levels (e.g., due to quantized states of electronic charge or magnetic flux). Superconducting qubits can be Josephson junction-based, such as transmon qubits and/or the like. Also, superconducting qubits can be compatible with microwave control electronics, and can be utilized with gate-based technology or integrated cryogenic controls. Additional exemplary qubit technologies can include, but are not limited to: photonic qubits, quantum dot qubits, gate-based neutral atom qubits, semiconductor qubits (e.g., optically gated or electrically gated), topological qubits, a combination thereof, and/or the like.

Figure 6:
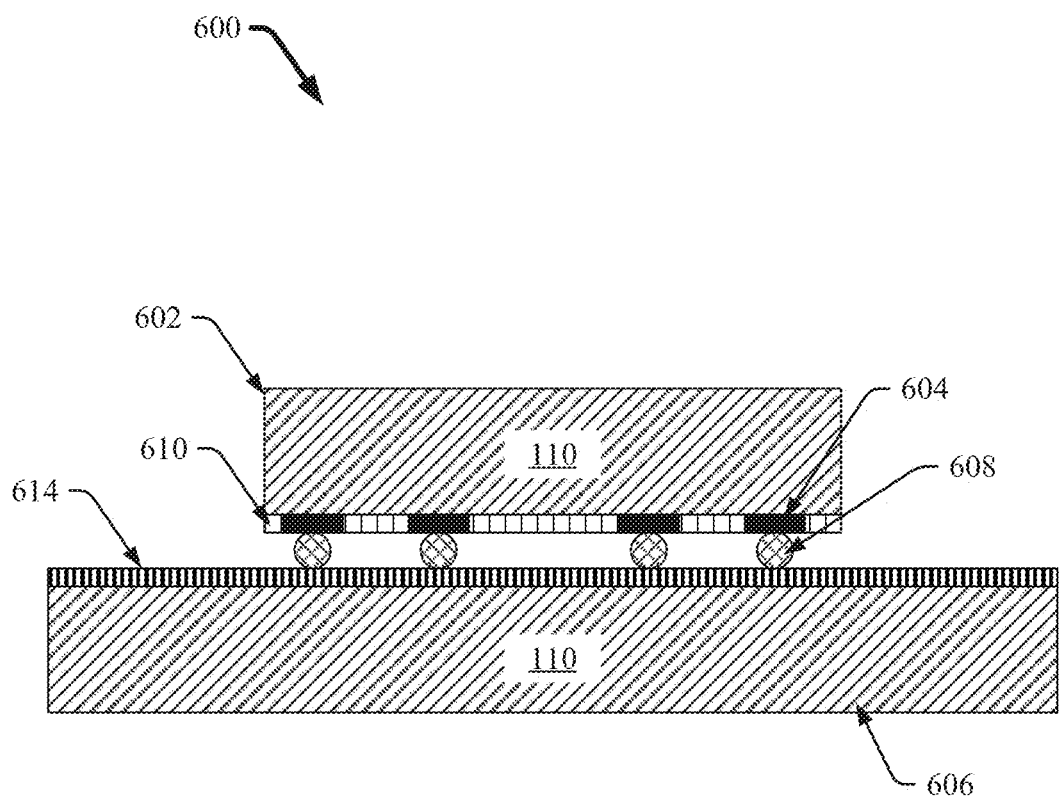
FIG. 6 illustrates a diagram of an example, non-limiting side view of a stacked quantum computing device in accordance with one or more embodiments described herein.
Figure 6:
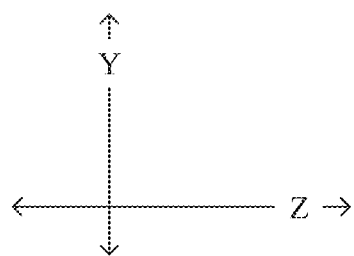

FIG. 6 illustrates a cross-sectional view of an example, non-limiting stacked quantum computing device 600 that can include the microstrip transmission line structure 100 in accordance with one or more embodiments described herein. Repetitive description of like elements employed in other embodiments described herein is omitted for sake of brevity. As shown in FIG. 6, the stacked quantum computing device 600 can comprise a first chip 602 that can include one or more superconducting qubits 604, and a second chip 606 that can include the microstrip transmission line structure 100. In various embodiments, the stacked quantum computing device 600 can be included in one or more quantum computers. For example, the first chip 602 can be included in the quantum data plane of a quantum computer, and/or the second chip 606 can be included in the control and measurement plane of the quantum computer. For instance, the second chip 606 can include one or more qubit readout resonators that include the microstrip transmission line structure 100.

To increase the superconducting qubit density, and thereby provide a greater number of superconducting qubits 604 for quantum data processing operations, the circuitry elements of a quantum computer can be formed on multiple chips coupled together. For example, the first chip 602 and the second chip 606 can each comprise circuitry elements of a given quantum computer, where the first chip 602 and the second chip 606 can be stacked together and/or coupled via, for example, superconducting interconnections. For instance, in one or more embodiments, superconducting interconnects 608, such as bump bonds, can be employed to electrically couple together one or more components of the first chip 602 with one or more components of the second chip 606. In another instance, one or more interconnects 608 bump bonds, can be employed to physically bond the first chip 602 and second chip 606 without providing an electrical coupling.

As shown in FIG. 6, the first chip 602 can include a qubit surface 610 facing the second chip 606. The qubit surface 610 can include the one or more superconducting qubits 604 and/or one or more circuitry elements that interconnect the one or more superconducting qubits 604. For example, the qubit surface 610 can include one or more superconducting resonator lines, buses, gates, filters, coupler qubits, direct capacitive couplers, a combination thereof, and/or like that can establish and/or facilitate electrical connections between the superconducting qubits 604. In various embodiments, the qubit surface 610 can be positioned on a low-loss dielectric substrate 110 of the first chip 602 that is suitable for quantum computing circuit elements (e.g., a silicon or sapphire wafer).

Also shown in FIG. 6, the second chip 606 can include a wiring surface 614 facing the first chip 602. The wiring surface 614 can include the microstrip transmission line structure 100. For example, the microstrip transmission line structure 100 can serve as one or wiring circuitries that facilitate the function of the control and measurement plane of the quantum computer. For instance, in various embodiments the wiring surface 614 can include qubit readout resonators that couple to the one or more superconducting qubits 604 and/or employ the microstrip transmission line structure 100. By moving the wiring circuitry of the control and measurement plane (e.g., qubit readout resonators that includes the microstrip transmission line structure 100) to a separate chip from the superconducting qubits 604, crosstalk between the superconducting qubits 604 and the wiring can be reduced. Additionally, the crosstalk can be further reduced by employing the microstrip transmission line structure 100 in one or more of the wiring circuitry elements, as the microstrip transmission line structure 100 can embed and shield a microstrip transmission line (e.g., comprised from the one or more superconducting material layers 102) under a superconducting ground plane (e.g., superconducting electrode 106).

In various embodiments, the first chip 602 can be aligned over the second chip 606 and physically connected via the one or more interconnects 608. In various embodiments, the one or more interconnects 608 can be one or more bump bonds. Further, in one or more embodiments the one or more interconnects 608 can electrically couple components between the first chip 602 and the second chip 606. In one or more embodiments, a vacuum can be maintained between the first chip 602 and the second chip 606.

In one or more embodiments, one or more of the interconnects 608 can be superconducting bump bonds that can electrically couple components between the first chip 602 and the second chip 606. Example materials that can be comprised in the one or more superconducting bump bonds can include, but are not limited to: indium, lead, rhenium, palladium, niobium, gold, titanium, a combination thereof, and/or the like. The thickness of the interconnects 608 (e.g., along the "Y" axis shown in FIG. 6) can define a distance between the first chip 602 and the second chip 606. In various embodiments, the spacing between the first chip 602 and the second chip 606 can influence a capacitive or inductive coupling between components of the first chip 602 and the second chip 606. The thickness of the interconnects 608 (e.g., along the "Y" axis shown in FIG. 6) can be, for example, greater than or equal to 20 μm and less than or equal to 100 μm.

Figure 7:
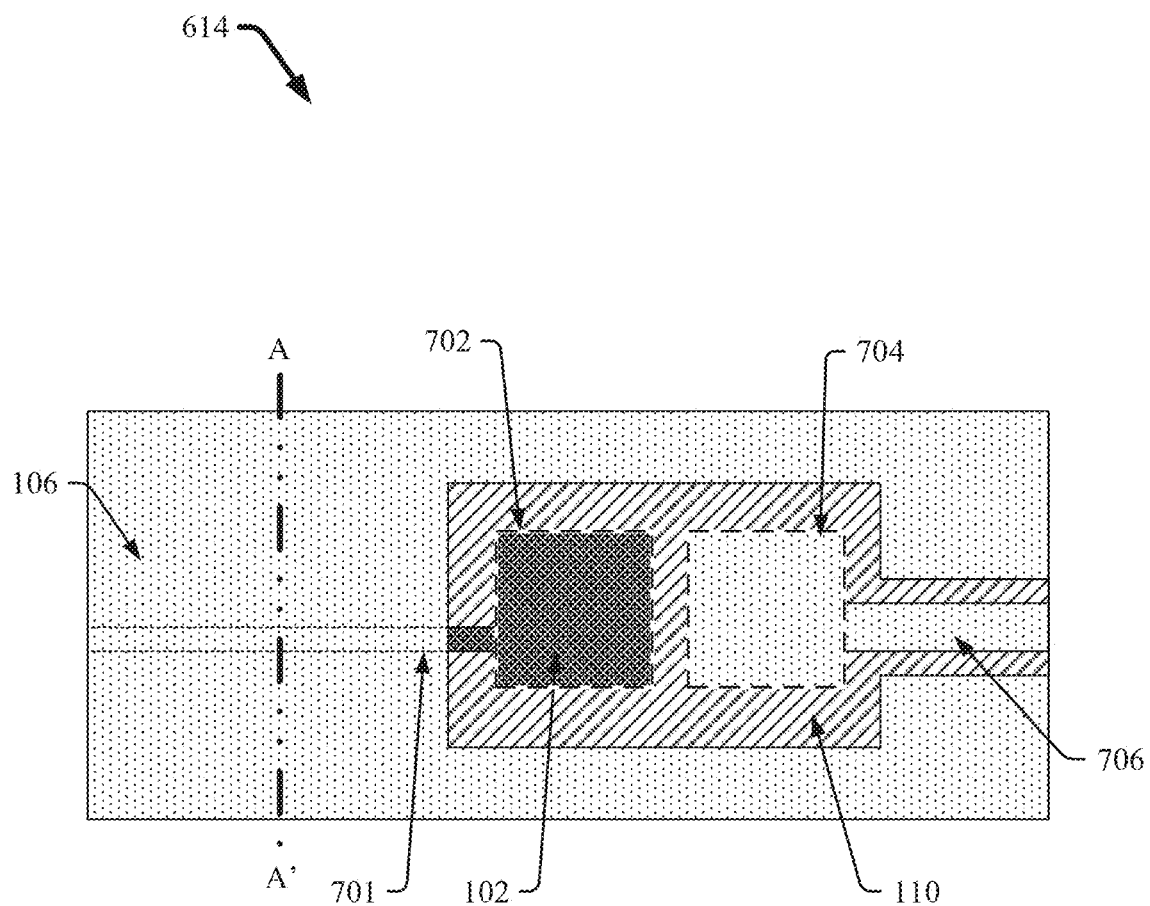
FIG. 7 illustrates a diagram of an example, non-limiting top-down view of a chip from a quantum computing device that can comprise an embedded microstrip transmission line that can be operably coupled to a coplanar waveguide transmission line in accordance with one or more embodiments described herein.

FIG. 7 illustrates a top-down view of the example, non-limiting second chip 606 in accordance with one or more embodiments described herein. Repetitive description of like elements employed in other embodiments described herein is omitted for sake of brevity. The top-down view shown in FIG. 7 can depict a portion of the wiring surface 614 that faces the first chip 602. As shown in FIG. 7, the wiring surface 614 can include a wiring architecture comprising: a microstrip transmission line 701 electrically coupled to a first pad element 702, and a second pad element 704 electrically coupled to a coplanar waveguide ("CPW") transmission line 706. In various embodiments, the microstrip transmission line 701 can have the microstrip transmission line structure 100 and can be delineated by the dotted lines in FIG. 7. For example, the superconducting electrode 106 can serve as a superconducting ground plane coating at least a portion of the wiring surface 614, where the microstrip transmission line 701 can be embedded beneath the superconducting electrode 106 (e.g., as depicted in FIG. 1) at the location delineated by the dotted lines in FIG. 7.

As described herein, the microstrip transmission line 701 can have an architecture in accordance with the microstrip transmission line structure 100. For example, an exemplary positioning of the A-A' cross-section depicted in FIG. 1 is delineated in FIG. 7 to illustrate the structural features positioned underneath the superconducting ground plane of the second chip 606 that are not visible from the top-down view shown in FIG. 7. For instance, the microstrip transmission line 701 can be positioned on a raised portion 108 of the substrate 110 of the second chip 606 and can be at least partially covered by one or more low-loss dielectric films 104 in accordance with the microstrip transmission line structure 100.

In various embodiments, the one or more superconducting material layers 102 can form the microstrip transmission line 701 and the first pad element 702. As shown in FIG. 7, the microstrip transmission line structure 100 (e.g., the metal stack structure) can enable coexistence with one or more CPW transmission lines. For instance, the first pad element 702 can be positioned adjacent to a second pad element 704 that is coupled to a CPW transmission line 706. In one or more embodiments, the second pad element 704 and/or the one or more CPW transmission lines 706 can be comprised from the superconducting electrode 106. Thereby, a signal can be transitioned from the microstrip transmission line 701 (e.g., which can have a low impedance of about 15 olms (ohm)) to the CPW transmission line 706 (e.g., which can have a higher impedance of about 50 ohm). Additionally, in various embodiments, the first pad element 702 and/or the second pad element 704 can be aligned with one or more superconducting qubits 604 when the first chip 602 and the second chip 606 are stacked and/or bonded together.

In one or more embodiments, a portion of the superconducting electrode 106 can be etched away (e.g., during or after the fifth stage of manufacturing described herein) via one or more etching processes to expose the first pad element 702 and/or define the second pad element 704 and CPW transmission line 706. Further, a portion of the one or more dielectric films 104 can optionally be etched away with the portion of superconducting electrode 106 to expose the first pad element 702 and/or define the second pad element 704 and CPW transmission line 706 (e.g., as shown in FIG. 7). In one or more embodiments, the one or more dielectric films 104 can remain positioned over the first pad element 702. Also shown in FIG. 7, the microstrip transmission line 701 can extend underneath the superconducting electrode 106 (e.g., underneath the ground plane of the second chip 606) and electrically couple to the first pad element 702. Where the first pad element 702 is aligned with a superconducting qubit 604 of the first chip 602, the microstrip transmission line 701 can be laterally displaced from the qubit alignment.

Figure 8:
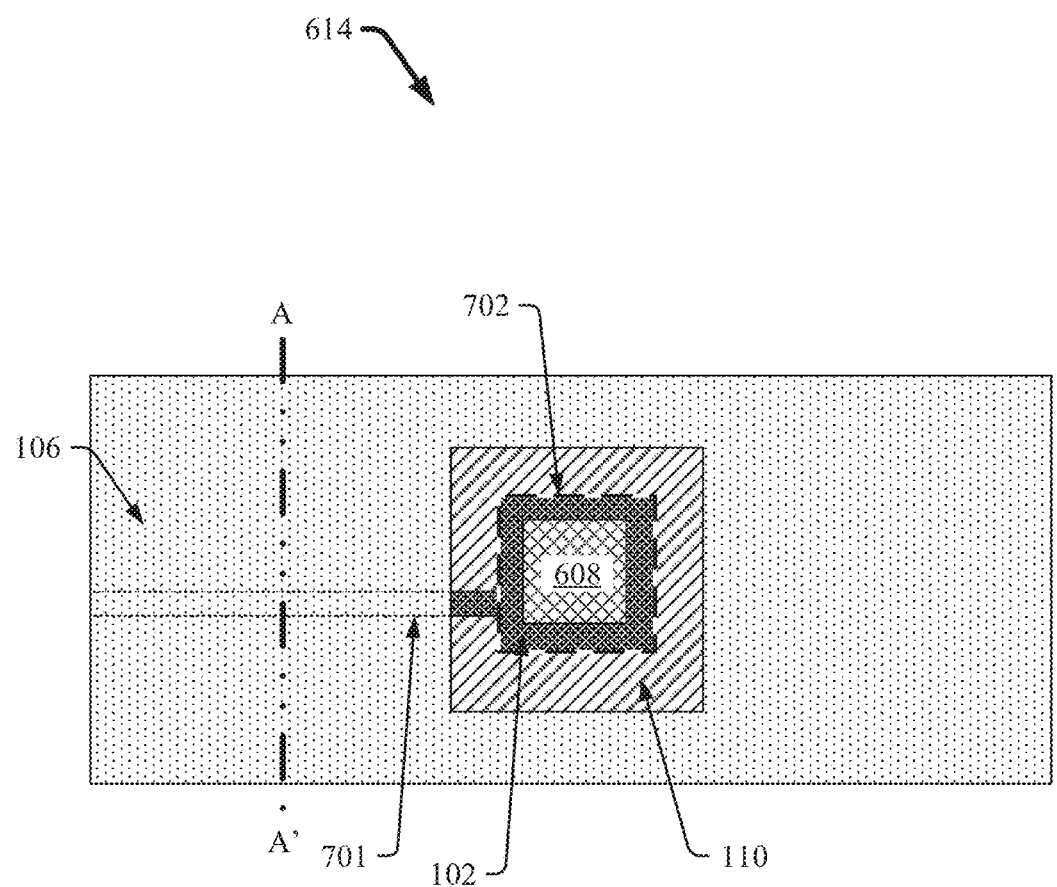
FIG. 8 illustrates a diagram of an example, non-limiting top-down view of a chip from a quantum computing device that can comprise an embedded microstrip transmission line that can be operably coupled to a signal bump in accordance with one or more embodiments described herein.

FIG. 8 illustrates another top-down view of the example, non-limiting second chip 606 in accordance with one or more embodiments described herein. Repetitive description of like elements employed in other embodiments described herein is omitted for sake of brevity. FIG. 8 depicts an exemplary qubit readout resonator structure that can be on the wiring surface 614 of the second chip 606 and can include the microstrip transmission line structure 100. For example, the qubit readout resonator depicted in FIG. 8 can comprise the microstrip transmission line 701 and the first pad element 702 described herein in accordance with one or more embodiments. Additionally, one or more of the interconnects 608 can be in direct contact with the first pad element 702 (e.g., the superconducting electrode 106 and the one or more dielectric films 104 can be etched away to expose the superconducting material layers 102 that form the first pad element 702). Further, the or more interconnects 608 positioned on the first pad element 702 can be electrically coupled to one or more superconducting qubits 604 of the first chip 602. As such, a signal carried on the microstrip transmission line 701 can be carried to or from another chip (e.g., the first chip 602) via a galvanic coupling.

In various embodiments, the first pad element 702 can be aligned with a superconducting qubit 604 when the first chip 602 and the second chip 606 are bonded together (e.g., via interconnects 608). For example, one or more of the interconnects 608 can be positioned on the first pad element 702 and can electrically couple the first pad element 702 to one or more aligned components of another chip (e.g., aligned components of the first chip 602). For instance, one or more of the interconnects 608 can be positioned on the first pad element 702 and can electrically couple the first pad element 702 to an aligned superconducting qubit 604 from the first chip 602. In one or more embodiments, one or more of the interconnects 608 can be a superconducting bump positioned on the first pad element 702 (e.g., as shown in FIG. 8). Thereby, a signal carried on the microstrip transmission line 701 can be transferred to or from another chip (e.g., to the first chip 602) through the interconnect (e.g., a superconducting bump) positioned on the first pad element 702.

Figure 9A:
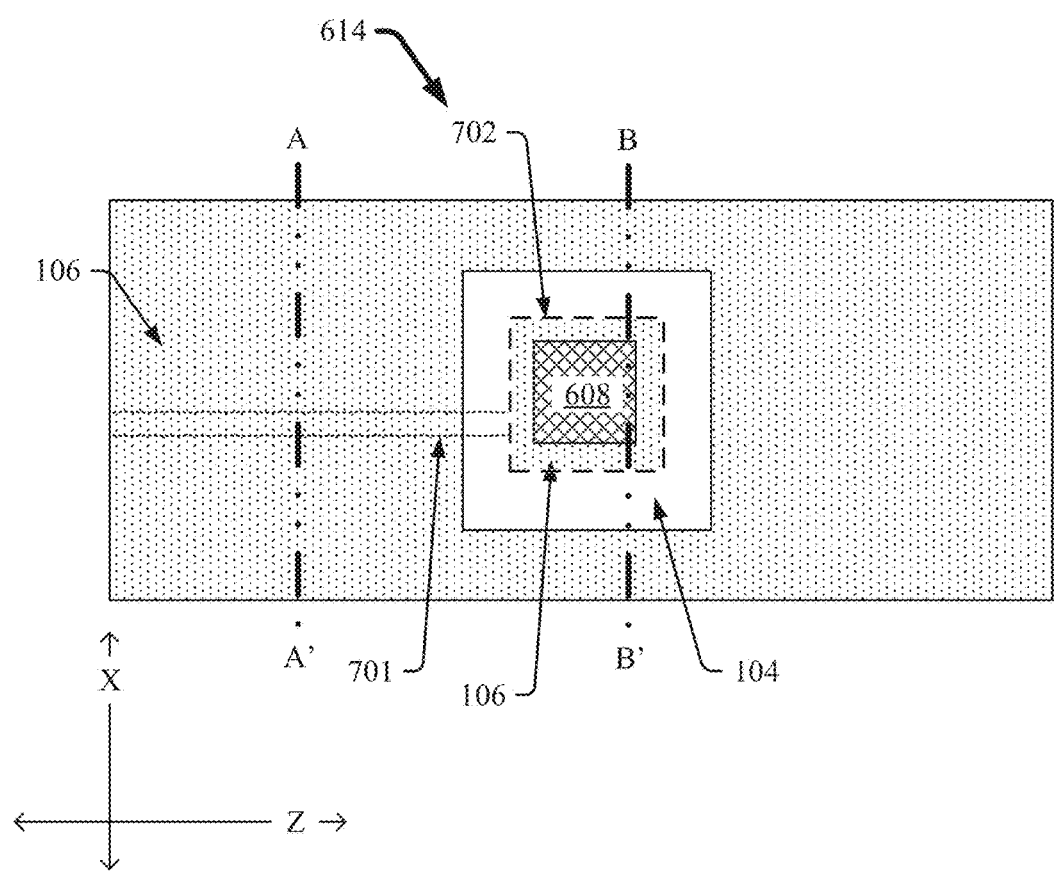
FIGS. 9A-9B illustrates diagrams of an example, non-limiting chip from a quantum computing device that can comprise an embedded microstrip transmission line that can be operably coupled to a signal bump in accordance with one or more embodiments described herein.

FIG. 9A illustrates another top-down view of the example, non-limiting second chip 606 in accordance with one or more embodiments described herein. Repetitive description of like elements employed in other embodiments described herein is omitted for sake of brevity. FIG. 9A depicts another exemplary qubit readout resonator structure that can be on the wiring surface 614 of the second chip 606 and can include the microstrip transmission line structure 100. For example, the qubit readout resonator structure depicted in FIG. 9A can comprise the microstrip transmission line 701 and the first pad element 702 described herein in accordance with one or more embodiments.

In various embodiments, the first pad element 702 (e.g., comprised from the one or more superconducting material layers 102) can remain covered by the one or more dielectric films 104 and superconducting electrode 106. As shown in FIG. 9A a portion of the superconducting electrode 106 surrounding a periphery of the first pad element 702 can be etched away via one or more etching processes, thereby exposing a portion of the one or more dielectric films 104. Further, one or more interconnects 608 can be positioned on the portion of superconducting electrode 106 covering the first pad element 702. For example, one or more superconducting bumps can be positioned on the superconducting electrode 106 over the first pad element 702. As such, a signal carried on the microstrip transmission line 701 can be carried to or from another chip (e.g., first chip 602) via a capacitive coupling. For instance, the first pad element 702 can be capacitively coupled (e.g., via an interconnect, such as a superconducting bump pad) to a superconducting qubit 604 of the first chip 602, where the amount of capacitive coupling can depend on: the size of the first pad element 702, the size of the aligned superconducting qubit 604, and/or the space between the first chip 602 and the second chip 606 (e.g., the thickness of the one or more interconnects 608).

Figure 9B:
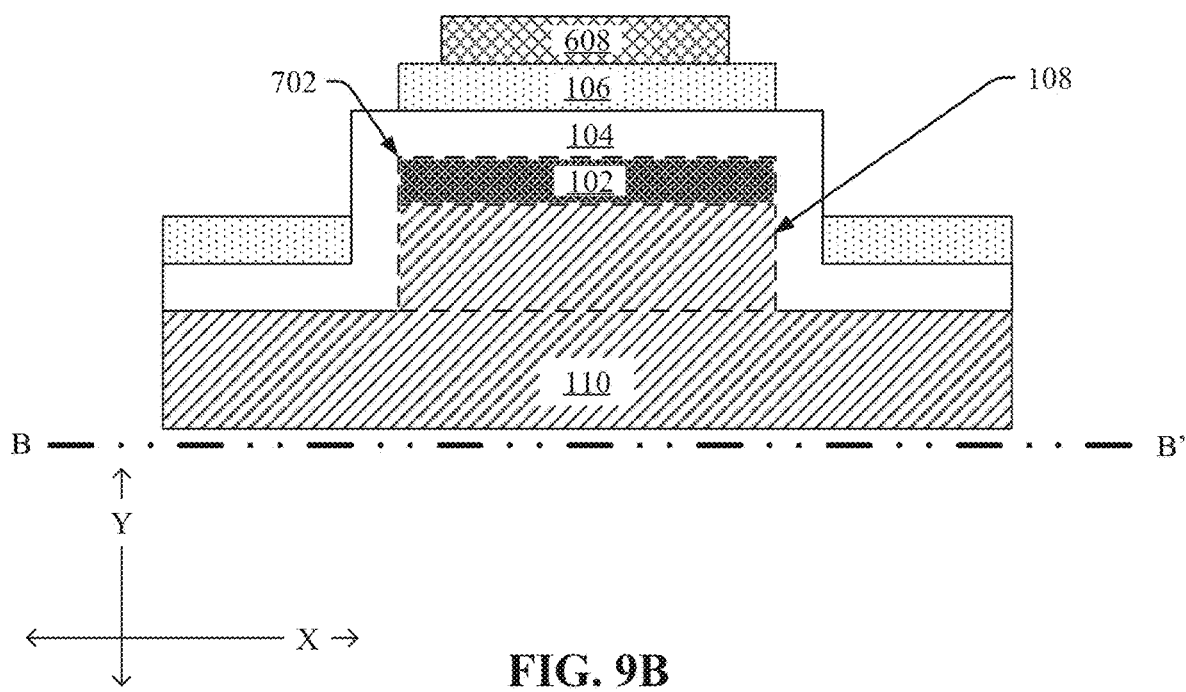

FIG. 9B illustrates a cross-sectional view of the example, non-limiting second chip 606 in accordance with one or more embodiments described herein. Repetitive description of like elements employed in other embodiments described herein is omitted for sake of brevity. FIG. 9B depicts a cross-section of the second chip 606 along the B-B' plane depicted in FIG. 9A to exemplify one or more structural features that are not otherwise visible from a top-down view of the second chip 606. As shown in FIG. 9B, the first pad element 702 can be comprised from the one or more superconducting material layers 102 positioned on a raised portion 108 of the substrate 110 of the second chip 606. Further, the first pad element 702 can be at least partially covered by the one or more dielectric films 104. Additionally, a portion of the superconducting electrode 106 can be etched away via one or more etching processes to expose a portion of the dielectric film 104 at least partially surrounding the first pad element 702. Additionally, one or more interconnects 608 (e.g., superconducting bump pads) can be positioned on the superconducting electrode 106 over the first pad element 702. As shown in FIGS. 7 and/or 8 the one or more dielectric films 104 can also be etched away in one or more embodiments to achieve one or more desired circuitry architectures on the wiring surface 614 of the second chip 606.

Figure 10:
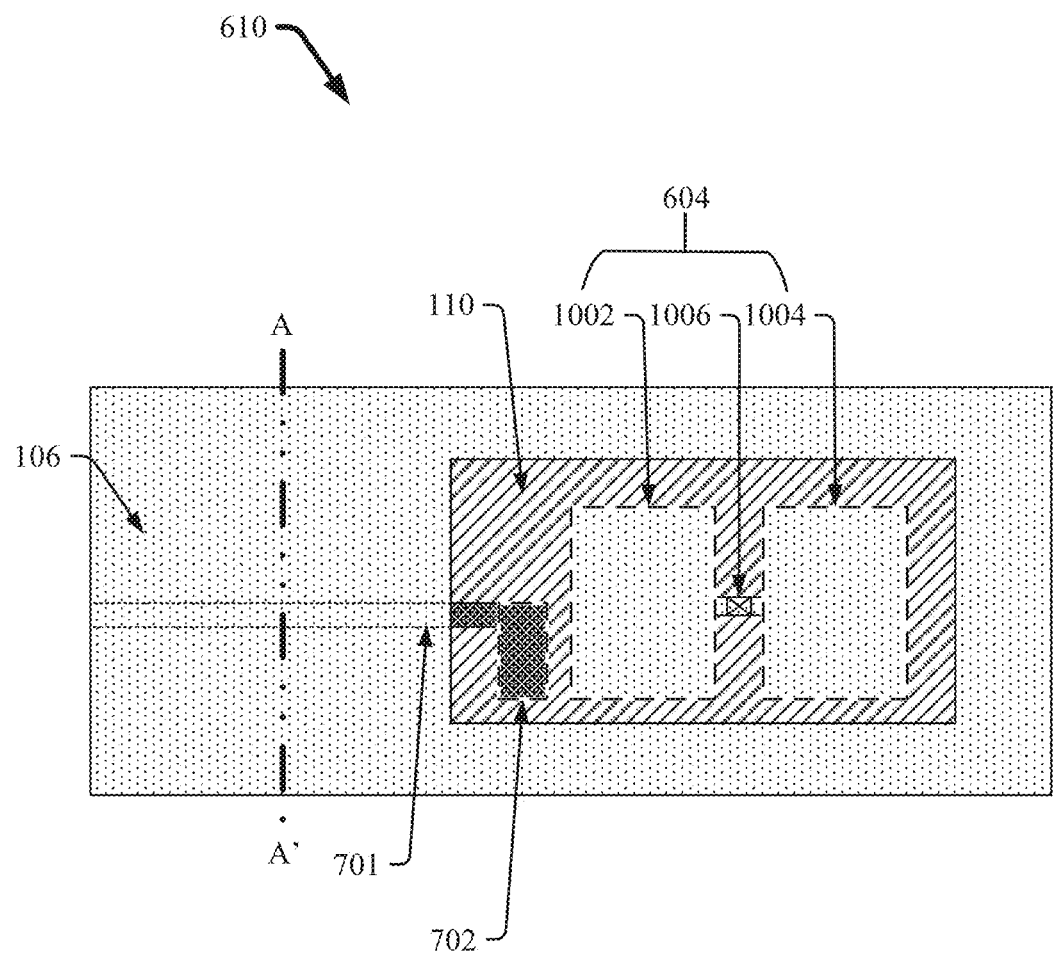
FIG. 10 illustrates a diagram of an example, non-limiting top-down view of a chip from a quantum computing device that can comprise an embedded microstrip transmission line that can be operably coupled to a qubit in accordance with one or more embodiments described herein.

FIG. 10 illustrates a top-down view of the example, non-limiting first chip 602 in accordance with one or more embodiments described herein. Repetitive description of like elements employed in other embodiments described herein is omitted for sake of brevity. For example, FIG. 10 shows a top-down view of the qubit surface 610, which can employ one or more transmission lines 701 (e.g., having the microstrip transmission line structure 100) operably coupled to one or more superconducting qubits 604. In various embodiments, where the first chip 602 employs the features of the microstrip transmission line structure 100 to couple the one or more superconducting qubits 604, the first chip 602 can be operated without the second chip 606. For example, the quantum computer can include the quantum computing circuitry on a single chip (e.g., the first chip 602) rather than amongst a plurality of chips (e.g., as shown in FIG. 6).

As shown in FIG. 10, the one or more superconducting qubits 604 can comprise a first capacitor pad 1002, a second capacitor pad 1004, and/or one or more Josephson junctions 1006 (e.g., delineated by an "☒" in FIG. 10). In various embodiments, the first capacitor pad 1002 and/or the second capacitor pad 1004 can comprise a superconducting metal, such as aluminum, niobium, titanium, rhenium, titanium nitride, tantalum, a combination thereof, and/or the like. Additionally, the one or more Josephson junction can include one or more tunnel barriers formed from a superconducting metal/metal oxide/superconducting metal structure, such as an aluminum/aluminum oxide/aluminum structure.

In various embodiments, the qubit surface 610 can be formed by etching away the superconducting electrode 106 and the one or more dielectric films 104 to expose the first pad element 702 (e.g., comprised from the one or more superconducting material layers 102) and the future location of the superconducting qubit 604. For example, subsequent to the fifth stage of manufacturing described herein, the top superconducting electrode 106 can be patterned (e.g., via one or more lithography processes). Further, one or more etching processes can be employed to selectively etch away the superconducting electrode 106 and the one or more dielectric layers 104 in accordance with the patterning to expose the one or more superconducting material layers 102 that can constitute the first pad element 702 and a portion of the top surface 112 of the substrate 110.

The exposed portion of the top surface 112 can then be cleaned, and one or more superconducting metals can be deposited (e.g., via one or more deposition processes) onto the exposed top surface 112 to form the superconducting qubit 604. Thereby, the one or more superconducting qubits 604 can be deposited onto the same chip as the microstrip transmission line 701 (e.g., the same substrate 110 as the microstrip transmission line structure 100) without the dielectric film 104 being positioned under the first capacitor pad 1002 or the second capacitor pad 1004.

FIG. 11 illustrates a flow diagram of an example, non-limiting method 1100 that can be employed to manufacture the microstrip transmission line structure 100 in accordance with one or more embodiments described herein. Repetitive description of like elements employed in other embodiments described herein is omitted for sake of brevity. In various embodiments, method 1100 can be employed to manufacture the microstrip transmission line 701 and/or first pad element 702 described herein in one or more embodiments. For example, the method 1100 can be employed to manufacture a qubit readout resonator, where crosstalk between the qubit readout resonator and one or more superconducting qubits (e.g., superconducting qubits 604) can be inhibited by embedded nature of the microstrip transmission line 701 on the raised portion 108 of dielectric substrate 110 and under the dielectric film 104 and superconducting electrode 106.

At 1102, the method 1100 can comprise depositing one or more superconducting material layers 102 onto a dielectric substrate 110. For example, the depositing at 1102 can be performed in accordance with the first stage of manufacturing described herein with reference to at least FIG. 2. At 1104, the method 1100 can comprise positioning the one or more superconducting material layers 102 onto a raised portion of the dielectric substrate 110 by etching into the one or more superconducting material layers and the dielectric substrate 110. For example, the positioning at 1104 can be performed in accordance with the second and third stages of manufacturing described herein with reference to at least FIGS. 3-4. For instance, the one or more superconducting material layers 102 can be patterning with one or more resist layers 302 to selectively recess the dielectric substrate 110 via one or more etching processes. Further, the etching at 1104 can define the positioning of portions of the one or more superconducting material layers 102 that can serve as one or more circuitry elements, such as transmission lines (e.g., microstrip transmission line 701) and/or coupling pads (e.g., first pad element 702).

At 1106, the method 1100 can comprise depositing one or more dielectric films 104 onto the one or more superconducting material layers and the dielectric substrate 110. For example, the depositing at 1106 can be performed in accordance with the fourth stage of manufacturing described herein with reference to at least FIG. 5. Additionally, one or more superconducting electrodes 106 can be deposited onto the one or more dielectric films 104 to form a ground plane. Thereby, the one or more superconducting material layers 102 can be positioned on the raised portion 108 of the dielectric substrate 110, covered by a dielectric film 104, and at least partially embedded under a superconducting ground plane.

FIG. 12 illustrates a flow diagram of an example, non-limiting method 1200 that can be employed to manufacture the microstrip transmission line structure 100 in accordance with one or more embodiments described herein. Repetitive description of like elements employed in other embodiments described herein is omitted for sake of brevity. In various embodiments, method 1200 can be employed to manufacture one or more circuitry elements of the qubit surface 610 of the first chip 602 and/or the wiring surface 614 of the second chip 606.

At 1202, the method 1200 can comprise depositing one or more superconducting material layers 102 onto a dielectric substrate 110. For example, the depositing at 1202 can be performed in accordance with the first stage of manufacturing described herein with reference to at least FIG. 2. In various embodiments, the dielectric substrate 110 can be a dielectric wafer for the first chip 602 or the second chip 606. At 1204, the method 1200 can comprise patterning the one or more superconducting material layers 102 with one or more resist layers 302. For example, the patterning at 1204 can be performed in accordance with the second stage of manufacturing described herein with reference to at least FIG. 3. In various embodiments, the patterning at 1204 can define the positioning of the one or more microstrip transmission lines 701 and/or first pad elements 702.

At 1206, the method 1200 can comprise etching (e.g., via one or more etching processes) the one or more superconducting material layers 102 and the dielectric substrate 110 in accordance with the patterning from 1204. For example, the etching at 1206 can be performed in accordance with the third stage of manufacturing described herein with reference to at least FIG. 4. In various embodiments, the etching at 1206 can form the raised portion 108 of the dielectric substrate 110 upon which the one or more superconducting material layers 102 of the microstrip transmission line 701 and/or first pad element 702 can be positioned.

At 1208, the method 1200 can comprise depositing (e.g., via one or more deposition processes) one or more dielectric films 104 onto the one or more superconducting material layers 102 and the dielectric substrate 110. For example, the depositing at 1208 can be performed in accordance with the fourth stage of manufacturing described herein with reference to at least FIG. 5. At 1210, the method 1200 can comprise depositing (e.g., via one or more deposition processes) a superconducting electrode 106 onto the one or more dielectric films 104 and over the one or more superconducting material layers 102. At 1212, the method 1200 can comprise patterning the superconducting electrode 106 with one or more resist layers 302. At 1214, the method 1200 can comprise etching (e.g., via one or more etching processes) the superconducting electrode in accordance with the patterning at 1212. In one or more embodiments, the etching at 1214 can further etch away one or more portions of the one or more dielectric films 104 positioned under the superconducting electrode 106. In various embodiments, the etching at 1214 can define and/or facilitate the formation of one or more circuitry elements on the qubit surface 610 and/or the wiring surface 614. For example, the etching at 1214 can expose the first pad element 702 and/or define the second pad element 704 and/or the CPW transmission line 706, as depicted in FIG. 7. In another example, the etching at 1214 can expose the first pad element 702 for contact with an interconnect 608, as depicted in FIG. 8. In a further example, the etching at 1214 can define a portion of the superconducting electrode over the first pad element 702 for capacitive coupling, as depicted in FIG. 9A.

In a still further example, the etching at 1214 can expose the top surface of the dielectric substrate 110 for formation of one or more superconducting qubits 604. For instance, at 1216 the method 1200 can comprise forming a superconducting qubit on an exposed surface of the dielectric substrate 110. For instance, the forming at 1216 can be performed by depositing one or more superconducting metals onto the exposed surface of the dielectric substrate 110 adjacent to the first pad element 702, as depicted in FIG. 10.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
   a superconducting material layer positioned on a raised portion of a dielectric substrate, wherein the raised portion extends from a surface of the dielectric substrate;
   a dielectric film that covers at least a portion of the superconducting material layer and the raised portion of the dielectric substrate; and
   a superconducting electrode positioned on the dielectric film and over the superconducting material layer.

2. The apparatus of claim 1, wherein the dielectric film has a loss tangent that is less than or equal to 5e-5 at a frequency that is between 4.5 gigahertz and 5.5 gigahertz.

3. The apparatus of claim 1, wherein the raised portion extends from the surface to a distal end, and wherein the superconducting material layer is on a surface of the distal end.

4. The apparatus of claim 3, wherein the superconducting material layer is confined to the second surface.

5. The apparatus of claim 3, wherein the superconducting electrode extends from a first position over the superconducting material layer to a second position over the first surface of the dielectric substrate.

6. The apparatus of claim 5, wherein the superconducting material layer is located at a first height from the first surface, wherein the superconducting electrode at the second position is located at a second height from the first surface, and wherein the first height is greater than the second height.

7. The apparatus of claim 3, wherein the superconducting material layer is a microstrip transmission line, wherein the superconducting electrode is a ground plane, and wherein the microstrip transmission line is embedded under the ground plane.

8. The apparatus of claim 6, wherein the apparatus is a qubit readout resonator.

9. A method, comprising:
depositing a superconducting material layer onto a dielectric substrate;
positioning the superconducting material layer onto a raised portion of the dielectric substrate by etching into the superconducting material layer and the dielectric substrate;
depositing a dielectric film onto the superconducting material layer and the dielectric substrate; and
depositing a superconducting electrode onto the dielectric film and over the superconducting material layer.

10. The method of claim 9, wherein the etching forms the raised portion by recessing the dielectric substrate.

11. The method of claim 9, wherein the dielectric film and the superconducting electrode extend over a portion of the dielectric substrate recessed by the etching.

12. The method of claim 9, wherein the dielectric film has a loss tangent that is less than or equal to 5e-5 at a frequency that is between 4.5 gigahertz and 5.5 gigahertz.

13. The method of claim 9, further comprising:
removing a portion of the dielectric film from over a portion of the dielectric substrate recessed by the etching; and
forming a superconducting qubit by depositing a superconducting metal onto the portion of the dielectric substrate recessed by the etching.

14. An apparatus, comprising:
a first chip that includes a superconducting qubit positioned on a first dielectric substrate; and
a second chip bonded to the first chip that includes: a superconducting material layer positioned on a raised portion of a second dielectric substrate, and a dielectric film that covers at least a portion of the superconducting material layer and the raised portion, wherein the raised portion extends from a surface of the dielectric substrate.

15. The apparatus of claim 14, wherein the dielectric film has a loss tangent that is less than or equal to 5e-5 at a frequency that is between 4.5 gigahertz and 5.5 gigahertz.

16. The apparatus of claim 15, wherein the second chip further comprises a superconducting electrode positioned on the dielectric film and located between the dielectric film and the first chip.

17. The apparatus of claim 16, wherein the superconducting material layer is a qubit readout resonator positioned on the second chip.

18. The apparatus of claim 16, wherein the superconducting material layer forms a microstrip transmission line and a pad element of a qubit readout resonator, and wherein the pad element is electrically coupled with the superconducting qubit.

* * * * *